United States Patent
Li

(10) Patent No.: US 11,233,143 B2
(45) Date of Patent: Jan. 25, 2022

(54) HIGH ELECTRON MOBILITY TRANSISTOR HAVING A BORON NITRIDE ALLOY INTERLAYER AND METHOD OF PRODUCTION

(71) Applicant: KING ABDULLAH UNIVERSITY OF SCIENCE AND TECHNOLOGY, Thuwal (SA)

(72) Inventor: Xiaohang Li, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 59 days.

(21) Appl. No.: 16/754,521

(22) PCT Filed: Oct. 15, 2018

(86) PCT No.: PCT/IB2018/057983
§ 371 (c)(1),
(2) Date: Apr. 8, 2020

(87) PCT Pub. No.: WO2019/077475
PCT Pub. Date: Apr. 25, 2019

(65) Prior Publication Data
US 2020/0273973 A1 Aug. 27, 2020

Related U.S. Application Data

(60) Provisional application No. 62/716,012, filed on Aug. 8, 2018, provisional application No. 62/574,301, filed on Oct. 19, 2017.

(51) Int. Cl.
*H01L 29/778* (2006.01)
*H01L 29/20* (2006.01)
*H01L 29/205* (2006.01)

(52) U.S. Cl.
CPC ...... *H01L 29/7786* (2013.01); *H01L 29/2003* (2013.01); *H01L 29/205* (2013.01)

(58) Field of Classification Search
CPC ............. H01L 29/7786; H01L 29/2003; H01L 29/205
See application file for complete search history.

(56) References Cited

U.S. PATENT DOCUMENTS

2010/0244096 A1* 9/2010 Sato ............... H01L 21/02381
257/190
2014/0327012 A1* 11/2014 Ougazzaden ....... H01L 29/7787
257/76

(Continued)

FOREIGN PATENT DOCUMENTS

JP 2015536570 A 12/2015
WO 2014078699 A1 5/2014

OTHER PUBLICATIONS

Sun et al, Band alignment of B0.14Al0.86N/Al0.7Ga0.3N heterojunction, Sep. 21, 2017, Applied Physics Letters, 111, pp. 122106-1-122106-5. (Year: 2017).*

(Continued)

*Primary Examiner* — Fernando L Toledo
*Assistant Examiner* — Valerie N Newton
(74) *Attorney, Agent, or Firm* — Patent Portfolio Builders PLLC

(57) ABSTRACT

A semiconductor device includes a III-nitride buffer layer and a III-nitride barrier layer. A boron nitride alloy interlayer interposed between the III-nitride buffer layer and the III-nitride barrier layer. A portion of the III-nitride buffer layer includes a two-dimensional electron gas (2DEG) channel that is on a side of the III-nitride buffer layer adjacent to the boron nitride alloy interlayer.

4 Claims, 4 Drawing Sheets

(56) References Cited

U.S. PATENT DOCUMENTS

2016/0300835 A1 10/2016 Xia et al.
2017/0278958 A1 9/2017 Xie et al.
2017/0365701 A1* 12/2017 Kim .................... H01L 29/7786

OTHER PUBLICATIONS

Guo, L., et al., "The Influence of 1 nm AlN Interlayer on Properties of the Al0.3Ga0.7N/AlN/GaN HEMT Structure," Microelectronics Journal, May 1, 2008, vol. 39, No. 5, pp. 777-781, ELSEVIER.
International Search Report in corresponding/related International Application No. PCT/IB2018/057983, dated Jan. 10, 2019.
Li, X., et al., "100-nm Thick Single-Phase Wurtzite BAlN Films with Boron Contents over 10%," Physica Status Solidi, Jan. 17, 2017, vol. 254, No. 8, 1600699 (5 pages), WILEY-VCH Verlag GmbH & Co. KGaA, Weinheim.
Sun, H., et al., "Band Alignment of B0.14Al0.86N/Al0.7Ga0.3N Heterojunction," Applied Physics Letters, Sep. 21, 2017, vol. 111, No. 12, pp. 122106-1-122106-5, AIP Publishing.
Written Opinion of the International Searching Authority in corresponding/related International Application No. PCT/IB2018/057983, dated Jan. 10, 2019.
First Office Action in corresponding/related JP Application No. 2020-522042, dated Jul. 12, 2021.

* cited by examiner

HIGH ELECTRON MOBILITY TRANSISTOR HAVING A BORON NITRIDE ALLOY INTERLAYER AND METHOD OF PRODUCTION This application is a U.S. National Stage Application of International Application No. PCT/IB2018/057983, filed on Oct. 15, 2018, which claims priority to U.S. Provisional Patent Application No. 62/574,301, filed on Oct. 19, 2017, entitled "BORON-CONTAINED-NITRIDE-BASED INTERLAYER IN AlGaN/GaN HETEROSTRUCTURE FOR POWER ELECTRONICS," and U.S. Provisional Patent Application No. 62/716,012, filed on Aug. 8, 2018, entitled "HIGH ELECTRON MOBILITY TRANSISTOR HAVING A BORON NITRIDE ALLOY INTERLAYER AND METHOD OF PRODUCTION," the disclosures of which are incorporated herein by reference in their entirety.

BACKGROUND

Technical Field

Embodiments of the disclosed subject matter generally relate to a high electron mobility transistor having a boron nitride alloy interlayer interposed between the barrier and buffer layers, and method of production.

Discussion of the Background

Gallium nitride- (GaN-) based semiconductors are typically used for high-power electronics due to their large bandgap (3.4 eV of GaN to 6.2 eV of aluminum nitride (AlN)) and high breakdown field (~3×10$^6$ V/cm). Additionally, due to its strong polarization fields (spontaneous and piezoelectric polarization), GaN-based heterojunctions are capable of producing high sheet charge densities in excess of 1×10$^{13}$ cm$^{-2}$ at the heterojunction's interface. Accordingly, high electron mobility transistors (HEMTs) having heterojunction of an aluminum gallium nitride (AlGaN) barrier layer formed on a GaN buffer layer, with an optional thin layer of aluminum nitride between the layers, are conventionally employed. Many efforts have been made to optimize such structures to achieve better device performance. In particular, a large two-dimensional electron gas (2DEG) concentration with high electron mobility would be expected for such device application.

In the conventional high electron mobility transistors comprising an aluminum gallium nitride/gallium nitride heterojunction, increasing the Al mole fraction in the aluminum gallium nitride barrier layer increases the two-dimensional electron gas concentration, but the alloy scattering effect reduces the electron mobility. Additionally, the higher Al-content in aluminum gallium nitride layer, the larger lattice mismatch between the aluminum gallium nitride layer and the gallium nitride layer, which degrades the interface quality in the heterojunction.

Thus, it would be desirable to provide for a high electron mobility transistor that has increased two-dimensional electron gas concentration while minimizing the electron mobility reduction caused by the alloy scattering effect and does not suffer from a large lattice mismatch between the buffer and barrier layers.

SUMMARY

According to an embodiment, a semiconductor device is provided. The semiconductor device includes a III-nitride buffer layer, a III-nitride barrier layer, and a boron nitride alloy interlayer interposed between the III-nitride buffer layer and the III-nitride barrier layer. A portion of the III-nitride buffer layer includes a two-dimensional electron gas (2DEG) channel that is on a side of the III-nitride buffer layer adjacent to the boron nitride alloy interlayer.

According to an embodiment, a method for forming a semiconductor device is provided. A III-nitride buffer layer is formed. A first interlayer is formed on the III-nitride buffer layer. A second interlayer is formed on the III-nitride interlayer. The first interlayer is one of a III-nitride interlayer and a boron nitride alloy interlayer and the second interlayer is the other one of the III-nitride interlayer and the boron nitride alloy interlayer. A III-nitride barrier layer is formed on the second interlayer. A portion of the III-nitride buffer layer includes a two-dimensional electron gas (2DEG) channel that is adjacent to the first interlayer.

According to an embodiment, a semiconductor device is provided. The semiconductor device includes a III-nitride buffer layer, a first interlayer arranged on the III-nitride buffer layer, a second interlayer arranged on the III-nitride interlayer, and a III-nitride barrier layer arranged on the boron nitride alloy interlayer. The first interlayer is one of a III-nitride interlayer and a boron nitride alloy interlayer and the second interlayer is the other one of the III-nitride interlayer and the boron nitride alloy interlayer. A portion of the III-nitride buffer layer includes a two-dimensional electron gas (2DEG) channel that is on a side of the III-nitride buffer layer adjacent to the III-nitride interlayer.

BRIEF DESCRIPTION OF THE DRAWINGS

The accompanying drawings, which are incorporated in and constitute a part of the specification, illustrate one or more embodiments and, together with the description, explain these embodiments. In the drawings.

DETAILED DESCRIPTION

The following description of the exemplary embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to the terminology and structure of high electron mobility transistors.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

Figure 1:
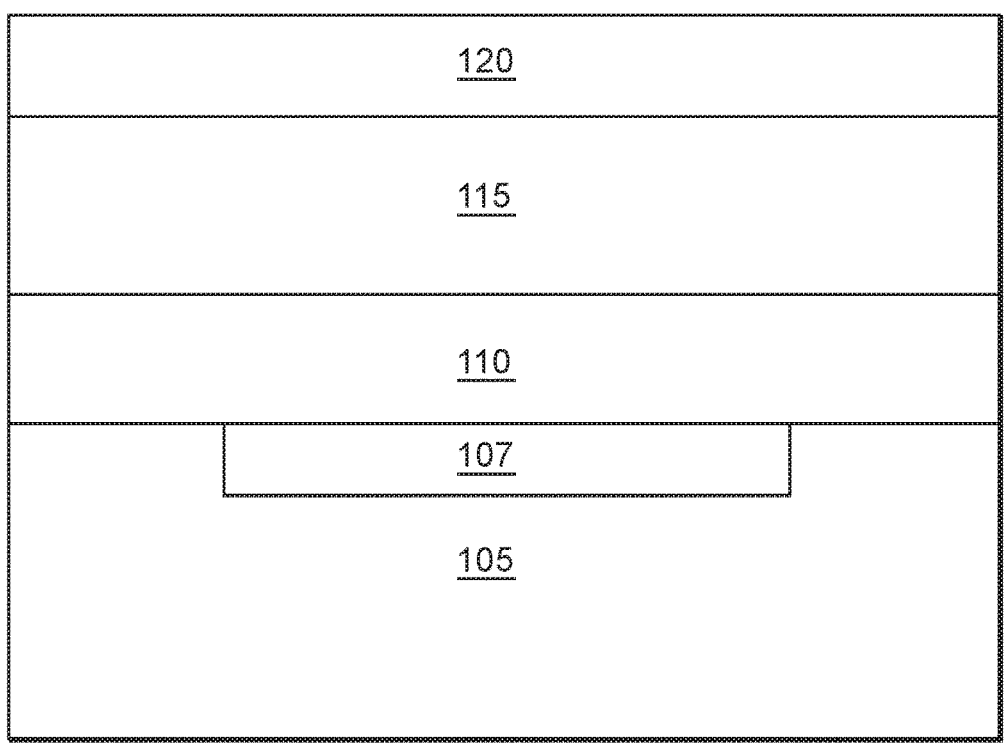
FIG. 1 is a block diagram of a semiconductor device according to embodiments.

FIG. 1 is a block diagram of a semiconductor device according to embodiments. The semiconductor device 100 includes a III-nitride buffer layer 105, a III-nitride barrier layer 115, and a boron nitride alloy interlayer 110 interposed between the III-nitride buffer layer 105 and the III-nitride barrier layer 115. A portion of the III-nitride buffer layer 105 includes a two-dimensional electron gas (2DEG) channel 107 that is on a side of the III-nitride buffer layer 105 adjacent to the boron nitride alloy interlayer 110. In the illustrated embodiment, the 2DEG channel 107 is adjacent to the boron nitride alloy interlayer 110 without any intervening layers. Those skilled in the art will appreciate that in the 2DEG can extend beyond the III-nitride buffer layer 105 into the boron nitride alloy interlayer 110 and/or the III-nitride barrier layer 115. The semiconductor device 100 can also include a III-nitride cap layer 120 arranged on the III-nitride barrier layer 115. It should be recognized that a cap layer is not necessary but improves the overall device performance.

As will be appreciated, the semiconductor device 100 is a high electron mobility transistor. Thus, the conduction band minimum of the III-nitride barrier layer 115 must be higher than the conduction band minimum of the III-nitride buffer layer 105. Further, the conduction band minimum of the boron nitride alloy interlayer 110 must be higher than the conduction band minimum of the III-nitride buffer layer 105. Moreover, there must be a polarization difference between the III-nitride barrier layer 115 and the III-nitride buffer layer 105 so that a 2DEG channel is formed on the upper portion of the III-nitride buffer layer 105 when the III-nitride buffer layer 105 and the III-nitride barrier layer 115 form a heterojunction. Additionally, there must be a polarization difference between the boron nitride alloy interlayer 110 and the buffer layer 105 so that a 2DEG channel is formed on the upper portion of the III-nitride buffer layer 105 when the boron nitride alloy interlayer 110 and the barrier layer 115 form a heterojunction. Further, there must be a polarization difference between the boron nitride alloy interlayer 110 and the III-nitride buffer layer 105 so that a 2DEG channel is formed on the upper portion of the III-nitride buffer layer 105 when the boron nitride alloy interlayer 110 and the III-nitride buffer layer 105 form a heterojunction.

In an embodiment, the buffer layer 105 can be a gallium nitride (GaN) buffer layer, the boron nitride alloy interlayer 110 can be a boron aluminum nitride (BAlN) interlayer, the barrier layer 115 can be an aluminum gallium nitride (AlGaN) barrier layer, and the cap layer 120 can be a gallium nitride (GaN) cap layer. Further, the gallium nitride buffer layer 105 can be, for example, 3 µm thick. The boron nitride alloy interlayer 110 can be, for example, a 1-2 nm thick boron aluminum nitride interlayer, such as a $B_{0.14}Al_{0.86}N$ interlayer. In other embodiments, the boron nitride alloy interlayer can have a thickness in the range of 0.1 to 10 nm. The boron percentage need not be 14% and instead can be any value between 0.1% and 100%. In other embodiments, the boron nitride alloy interlayer 110 can comprise one of: boron, gallium, and nitrogen; boron, indium, and nitrogen; boron, aluminum, gallium, and nitrogen; boron, indium, gallium, and nitrogen; boron, aluminum, indium, and nitrogen; and boron, aluminum, gallium, indium, and nitrogen.

The aluminum gallium nitride barrier layer 115 can, for example, be between 15 and 60 nm thick, and can comprise, for example, $Al_{0.3}Ga_{0.7}N$ or graded-composition material. The cap layer 120 can, for example, be 2 nm thick gallium nitride layer. As will be appreciated from FIG. 1, each layer is directly adjacent to, and in physical with, another layer without any intervening layers.

It will be recognized that the III-nitride buffer layer 105, boron nitride alloy interlayer 110, III-nitride barrier layer 115, and III-nitride cap layer 120 can comprise other III-nitride alloys than those discussed above. For example, the III-nitride buffer layer 105 can comprise gallium nitride (GaN), the boron nitride alloy interlayer 110 can comprise $B_{0.14}Al_{0.86}N$, and the III-nitride barrier layer 115 can comprise $Al_{0.30}Ga_{0.70}N$. In another example, the III-nitride buffer layer 105 can comprise gallium nitride (GaN), the boron nitride alloy interlayer 110 can comprise $B_{0.13}Al_{0.87}N$, and the III-nitride barrier layer 115 can comprise aluminum nitride (AlN). In a further example, the III-nitride buffer layer 105 can comprise $In_{0.15}Ga_{0.85}N$, the boron nitride alloy interlayer 110 can comprise $B_{0.15}Al_{0.85}N$, and the III-nitride barrier layer 115 can comprise gallium nitride (GaN). These are merely examples and should not be considered limiting.

Figure 2:
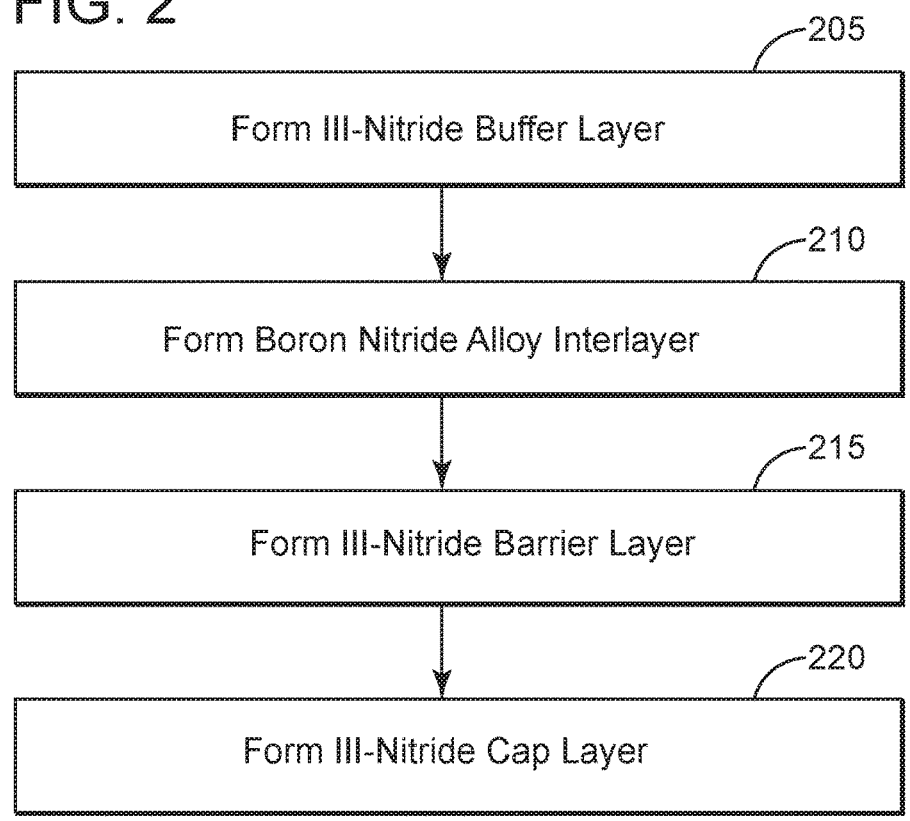
FIG. 2 is a flowchart of a method of forming a semiconductor device according to embodiments.

FIG. 2 is a flowchart of a method of forming the semiconductor device 100 of FIG. 1 according to embodiments. Initially, a III-nitride buffer layer 105 is formed on a substrate (not illustrated) (step 205). A boron nitride alloy interlayer 110 is then formed on the III-nitride buffer layer 105 (step 210). A III-nitride barrier layer 115 is formed on the boron nitride alloy interlayer 110 (step 215). Finally, a III-nitride cap layer 120 is formed on the III-nitride barrier layer 115 (step 220). A portion of the III-nitride buffer layer 105 includes a two-dimensional gas (2DEG) channel 107 on a side of the III-nitride buffer layer 105 that is adjacent to the boron nitride alloy interlayer 110.

The method of FIG. 2 can be performed using any suitable technique, such as, for example, metalorganic chemical vapor deposition (MOCVD) and molecular beam epitaxy (MBE). Details on growth conditions that can be used to produce high crystallinity of the boron aluminum nitride interlayer and the heterojunction can be found in X. Li et al., "100-nm thick single-phase wurtzite BAlN films with boron contents over 10%," Phys. Status Solidi B 254 (8), 1600699 (2017), and H. Sun et al., "Band alignment of B0.14Al0.86N/Al0.7Ga0.3N heterojunction," Appl. Phys. Lett. 111 (12), 122106 (2017).

Figure 3:
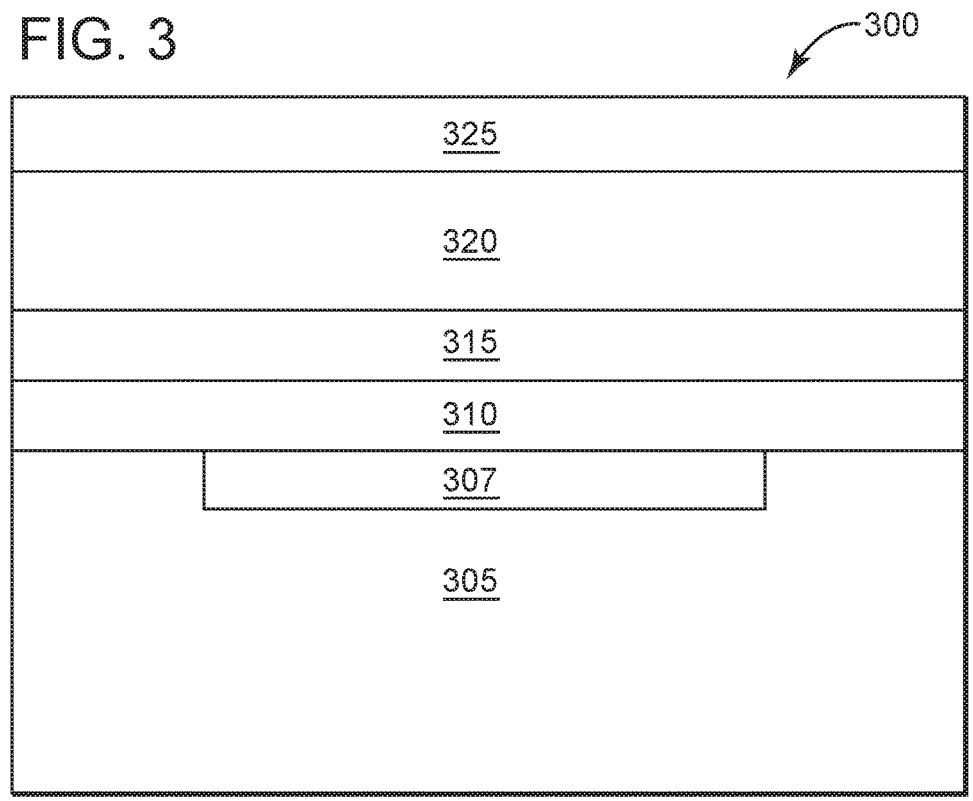
FIG. 3 is a block diagram of a semiconductor device according to embodiments.

FIG. 3 is a block diagram of a semiconductor device according to embodiments. Unlike the semiconductor device 100, the semiconductor device 300 includes at least two interlayers. Specifically, a III-nitride interlayer 310 is arranged on a III-nitride buffer layer 305 and a boron nitride alloy interlayer 315 is arranged on the III-nitride interlayer 310. A III-nitride barrier layer 320 is arranged on the boron nitride alloy interlayer 315. A portion of the III-nitride buffer layer 305 includes a 2DEG channel 307 that is adjacent to the III-nitride interlayer 310. Those skilled in the art will appreciate that in the 2DEG channel can extend beyond the III-nitride buffer layer 305 into the III-nitride interlayer 310, the boron nitride alloy interlayer 315, and/or the III-nitride barrier layer 320. The semiconductor device 300 can also include a III-nitride cap layer 325 arranged on the nitride barrier layer 320.

Although FIG. 3 illustrates the III-nitride interlayer 310 being directly adjacent to the III-nitride buffer layer 305 and the boron nitride alloy interlayer 315 being directly adjacent to the III-nitride barrier layer 320, the order of these interlayers in the device can be reversed so that the boron nitride alloy interlayer 315 is directly adjacent to the III-nitride buffer layer 305 and the III-nitride interlayer 310 is directly adjacent to the III-nitride barrier layer 320. The arrangement of the III-nitride interlayer 310 and the boron nitride alloy interlayer 315 relative to the III-nitride buffer layer 305 and the III-nitride barrier layer 320 will be depend upon the compositions of the III-nitride buffer layer 305 and the III-nitride barrier layer 320 and the intended application of the device.

As will be appreciated, the semiconductor device 300 is a high electron mobility transistor. Thus, the conduction band minimum of the III-nitride barrier layer 320 must be higher than the conduction band minimum of the III-nitride buffer layer 305. Further, the conduction band minimum of both the III-nitride interlayer 310 and the boron nitride alloy interlayer 315 must be higher than the conduction band minimum of the III-nitride buffer layer 305. Moreover, there must be a polarization difference between the III-nitride barrier layer 320 (or the boron nitride alloy interlayer 315 if the boron nitride interlayer is directly adjacent to the III-nitride buffer layer 305) and the III-nitride buffer layer 305 so that a 2DEG channel is formed on the upper portion of the III-nitride buffer layer 305 when the III-nitride buffer layer 305 (or the boron nitride alloy interlayer 315) and the III-nitride barrier layer 320 form a heterojunction.

In an embodiment, the III-nitride buffer layer 305 can be a gallium nitride (GaN) buffer layer, the III-nitride interlayer 310 can be an aluminum nitride interlayer, the boron nitride alloy interlayer 315 can be a boron aluminum nitride interlayer, the III-nitride barrier layer 320 can be an aluminum gallium nitride (AlGaN) barrier layer, and the cap layer 325 can be a gallium nitride (GaN) cap layer. Further, the gallium nitride buffer layer 305 can be, for example, 3 μm thick. The aluminum nitride interlayer 310 can be, for example, be a 0.5-1 nm thick. In other embodiments, the III-nitride interlayer 310 can be a boron nitride alloy interlayer.

The boron nitride alloy interlayer 315 can be, for example, a 0.5-1 nm thick boron aluminum nitride interlayer, such as a $B_{0.14}Al_{0.86}N$ interlayer. It should be recognized that the III-nitride interlayer 310 and the boron nitride alloy interlayer 315 can each have a thickness varying between 0.1 to 10 nm. Further, other embodiments, the boron nitride alloy interlayer 315 can comprise one of: boron, gallium, and nitrogen; boron, indium, and nitrogen; boron, aluminum, gallium, and nitrogen; boron, indium, gallium, and nitrogen; boron, aluminum, indium, and nitrogen; and boron, aluminum, gallium, indium, and nitrogen.

The aluminum gallium nitride barrier layer 320 can, for example, be between 5 and 60 nm thick, and can comprise, for example, $Al_{0.3}Ga_{0.7}N$. The gallium nitride cap layer 325 can, for example, be 2 nm thick. As will be appreciated from FIG. 3, each layer is directly adjacent to, and in physical with, another layer without any intervening layers.

It will be recognized that the III-nitride buffer layer 305, III-nitride barrier layer 320, and III-nitride cap layer 325 can comprise other types of III-nitrides other than those discussed above. Examples of other layer compositions for the semiconductor device 300 can be similar to those discussed above with regard to the semiconductor device 100.

Figure 4:
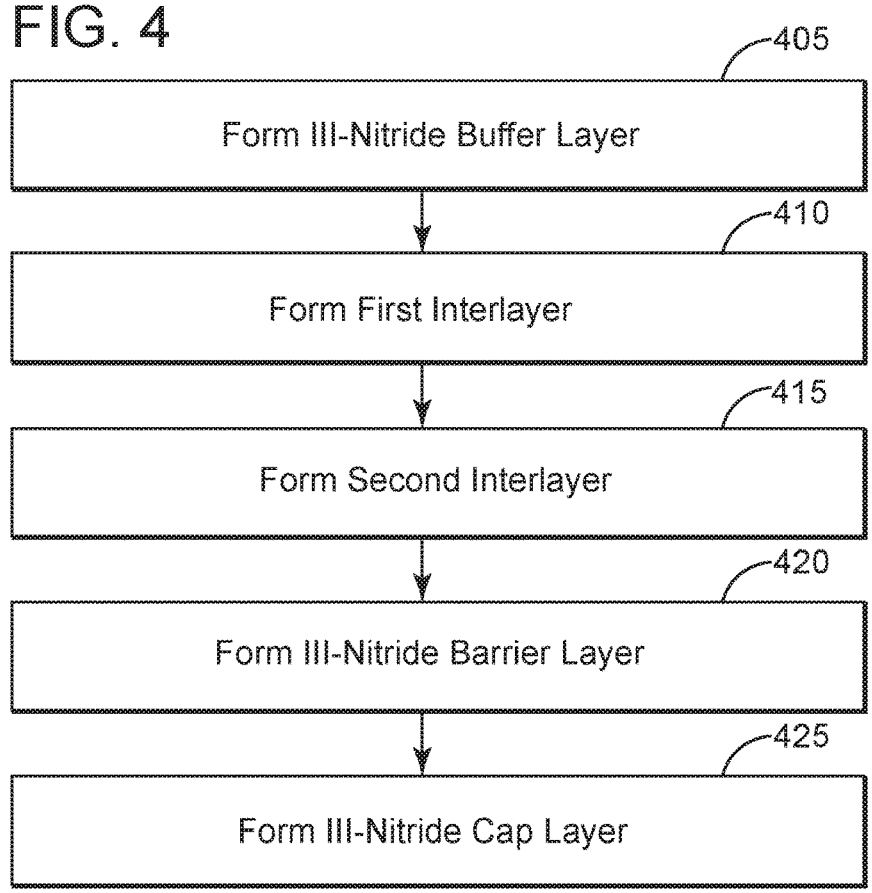
FIG. 4 is a flowchart of a method of forming a semiconductor device according to embodiments.

FIG. 4 is a flowchart of a method of forming the semiconductor device 300 of FIG. 3 according to embodiments. Initially, a III-nitride buffer layer 305 is formed on a substrate (not illustrated) (step 405). A first interlayer 310 or 315 is formed on the III-nitride buffer layer 305 (step 410) and a second interlayer 310 or 315 is then formed on the III-nitride interlayer 310 (step 415). The first interlayer is one of a III-nitride interlayer and a boron nitride alloy interlayer and the second interlayer is the one of the III-nitride interlayer and the boron nitride alloy interlayer. A III-nitride barrier layer 320 is formed on the second interlayer 310 or 315 (step 420). Finally, a III-nitride cap layer 325 is formed on the III-nitride barrier layer 320 (step 425). A portion of the III-nitride buffer layer 305 includes a 2DEG channel 307 that is adjacent to the first III-nitride interlayer 310 or 315. The method of FIG. 4 can be performed using any suitable technique, such as, for example, metalorganic chemical vapor deposition (MOCVD) and molecular beam epitaxy (MBE).

In order to appreciate the effectiveness of the disclosed interlayers, simulations were performed comparing a number of different interlayers. In the simulation setup, the semiconductor includes a gallium nitride buffer layer, an aluminum gallium nitride barrier layer, and a gallium nitride cap layer. Further, the thickness of the $Al_{0.3}Ga_{0.7}N$ barrier layer was initially fixed at 25 nm. The work function used for the Schottky gate is WF=5.1 eV, resulting in a barrier height of $e\phi_b$=0.84 eV.

The calculated two-dimensional electron gas concentration in the aluminum gallium nitride barrier layer based on this device configuration under different interlayer structures is depicted in the table below. In the table below, all interlayers having boron included 14% boron content; however, the boron content can be varied between 0.1% to 100%. GaN is used as the buffer layer.

| Interlayer Structure | Percentage of 2DEG in Ternary Layer (%) | 2DEG Density ($10^{13}/cm^2$) |
| --- | --- | --- |
| 1 nm Without Interlayer | 10.15 | 1.163 |
| 1 nm AlN | 0.00 | 1.343 |
| 1 nm BAlN | 0.091 | 1.512 |
| 0.5 nm BAlN/0.5 nm AlN with AlN adjacent to the buffer layer | 0.00 | 1.449 |
| 2 nm Without Interlayer | 10.29 | 1.174 |
| 2 nm AlN | 0.00 | 1.539 |
| 2 nm BAlN | 4.81 | 2.513 |
| 1 nm BAlN/1 nm AlN with AlN adjacent to the buffer layer | 0.00 | 1.865 |

It should be recognized that the two cases in the table above for "1 nm Without Interlayer" and "2 nm Without Interlayer" refer to devices without an interlayer and only including an aluminum gallium nitride barrier layer and gallium nitride buffer layer.

As will be appreciated from the table above, interlayers with 1 nm AlN, 0.5 nm BAlN/0.5 nm AlN, 2 nm AlN, 1 nm BAlN/1 nm AlN have the lowest (zero percentage) two-dimensional electron gas leakage to the AlGaN barrier layer and the 1 nm BAlN/1 nm AlN has the highest two-dimensional electron gas density.

Figure 5A:
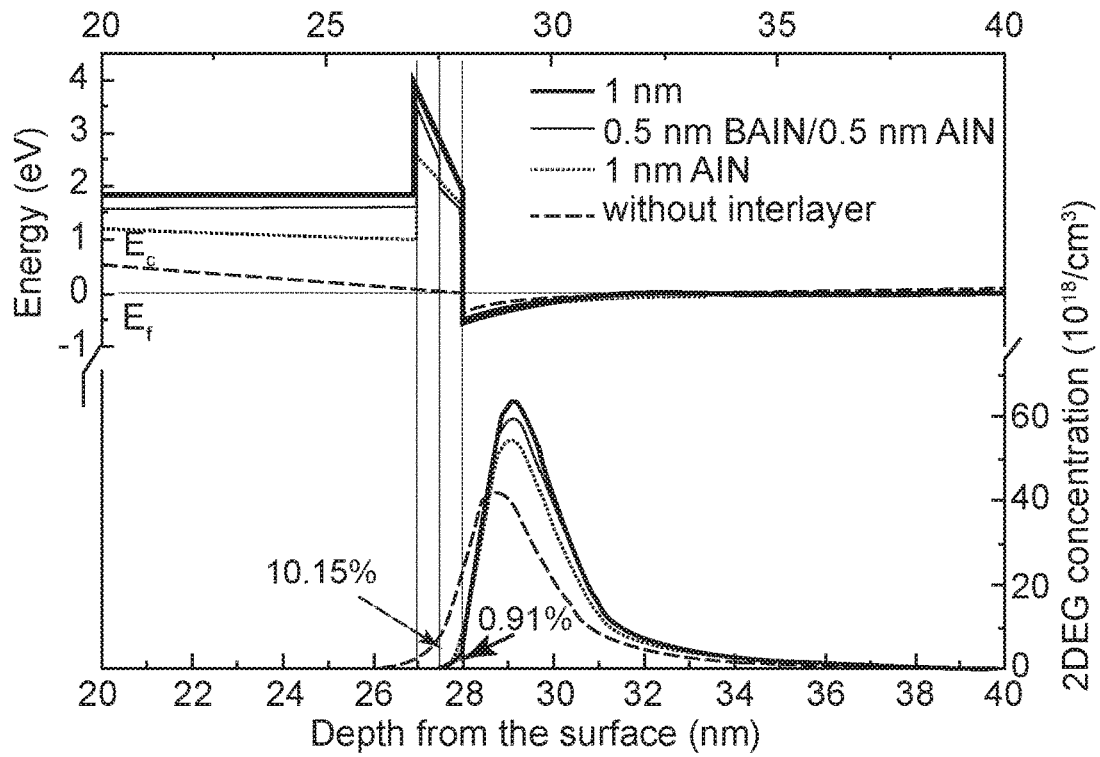
FIGS. 5A and 5B are graph of the two-dimensional electron gas (2DEG) concentration and band structure of high electron mobility transistors according to embodiments.
Figure 5B:
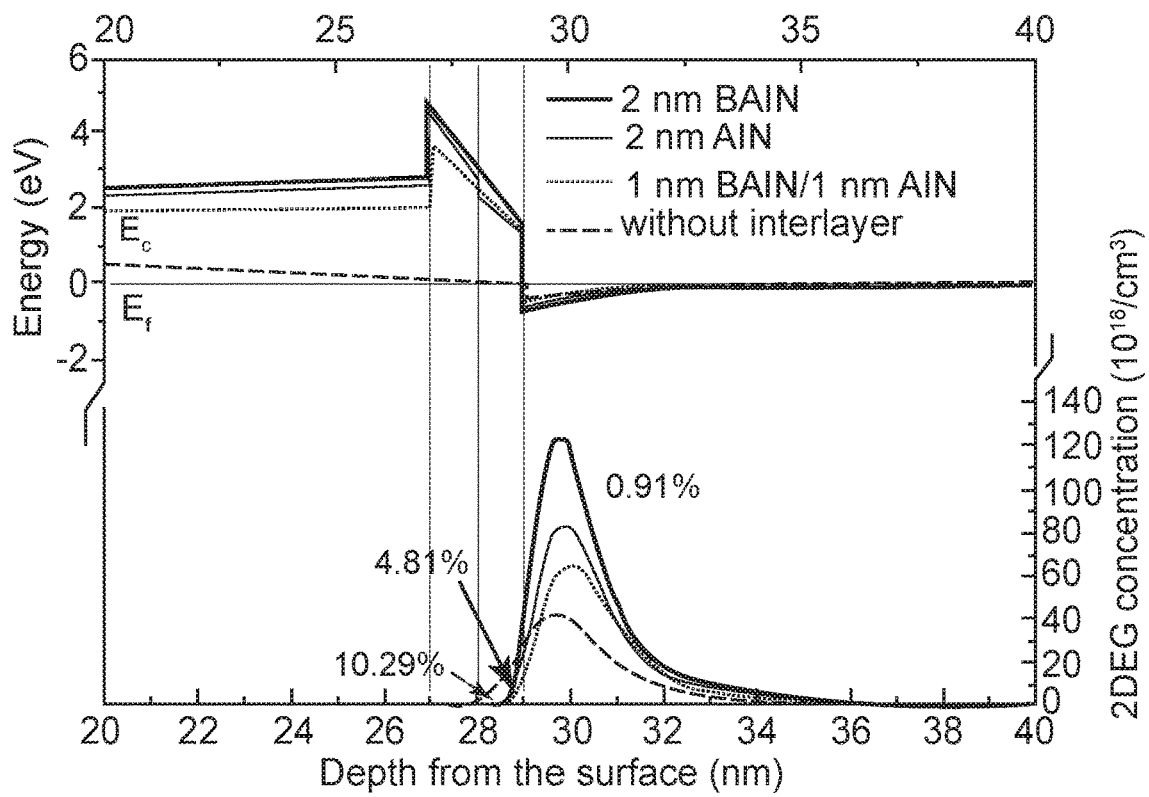

FIGS. 5A and 5B illustrate the two-dimensional electron gas concentration in the $Al_{0.3}Ga_{0.7}N$ barrier layer and band structure of device structures listed in the table above. As illustrated, an increase of two-dimensional electron gas concentration can be achieved by using 1 nm $B_{0.14}Al_{0.86}N$ as the interlayer instead of 1 nm AlN. Further, an increase of two-dimensional electron gas concentration can be achieved by replacing an interlayer of 2 nm AlN with an interlayer of 2 nm $B_{0.14}Al_{0.86}N$. Moreover, based on the band structure, the boron aluminum nitride interlayer increases the barrier height for the electrons to penetrate into $Al_{0.3}Ga_{0.7}N$ barrier layer, and thus improves the confinement of two-dimensional electron gas in the channel layer formed in the gallium nitride buffer layer. The boron aluminum nitride alloy of the interlayer will have lattice disorder, which will lead to the alloy scattering and reduce the mobility of high electron mobility transistor. This can be addressed by employing an interlayer heterojunction of, for example, $B_{0.14}Al_{0.86}N/AlN$ as the interlayer to reduce the alloy scattering while maintaining high two-dimensional electron gas concentration.

Figure 6:
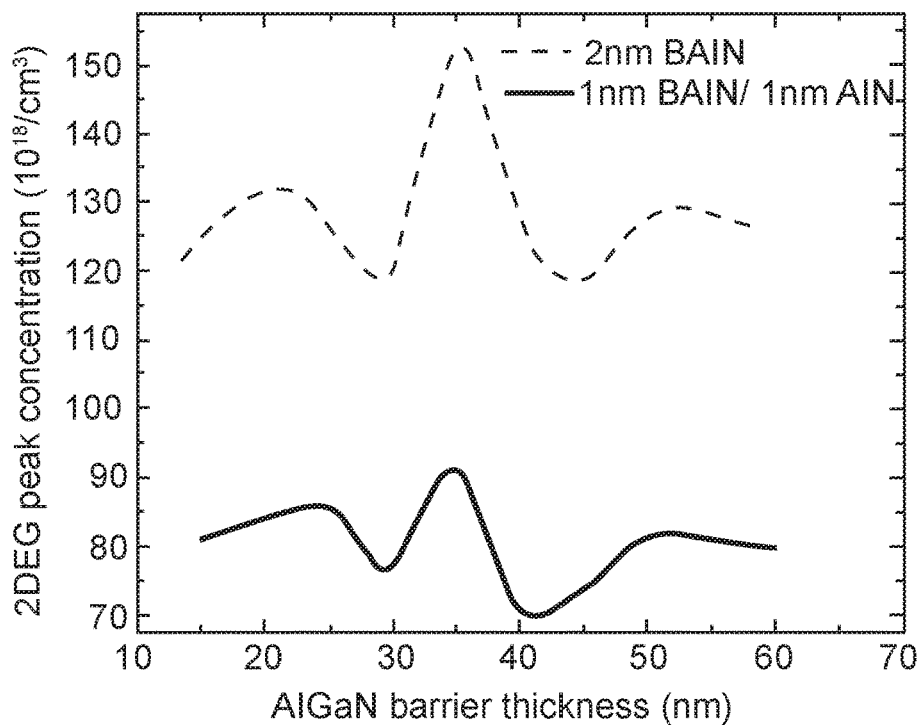
FIG. 6 is a graph of the two-dimensional electron gas peak concentration as a function of the barrier layer thickness according to embodiments.

The thickness of the $Al_{0.3}Ga_{0.7}N$ barrier layer should be optimized to achieve an optimal two-dimensional electron gas concentration. Accordingly, the thickness of the $Al_{0.3}Ga_{0.7}N$ barrier layer was varied from 15 to 60 nm while using 2 nm $B_{0.14}Al_{0.86}N$ and 1 nm $B_{0.14}Al_{0.86}N/1$ nm AlN as the interlayer, the results of which are illustrated in FIG. 6. As illustrated, a semiconductor device with a 2 nm $B_{0.14}Al_{0.86}N$ interlayer always performs better in terms of the two-dimensional electron gas density than a semiconductor device with 1 nm $B_{0.14}Al_{0.86}N/1$ nm AlN interlayers. Further, the highest two-dimensional electron gas is obtained when the $Al_{0.3}Ga_{0.7}N$ barrier thickness is 35 nm, which is the same for both cases regardless of whether a single 2 nm boron aluminum nitride interlayer is used or 1 nm BAlN/1 nm AlN interlayers are used. It should be recognized that if the aluminum content of aluminum gallium nitride barrier layer is increased, the optimal thickness of the barrier layer increases, and vice-versa.

Figure 7:
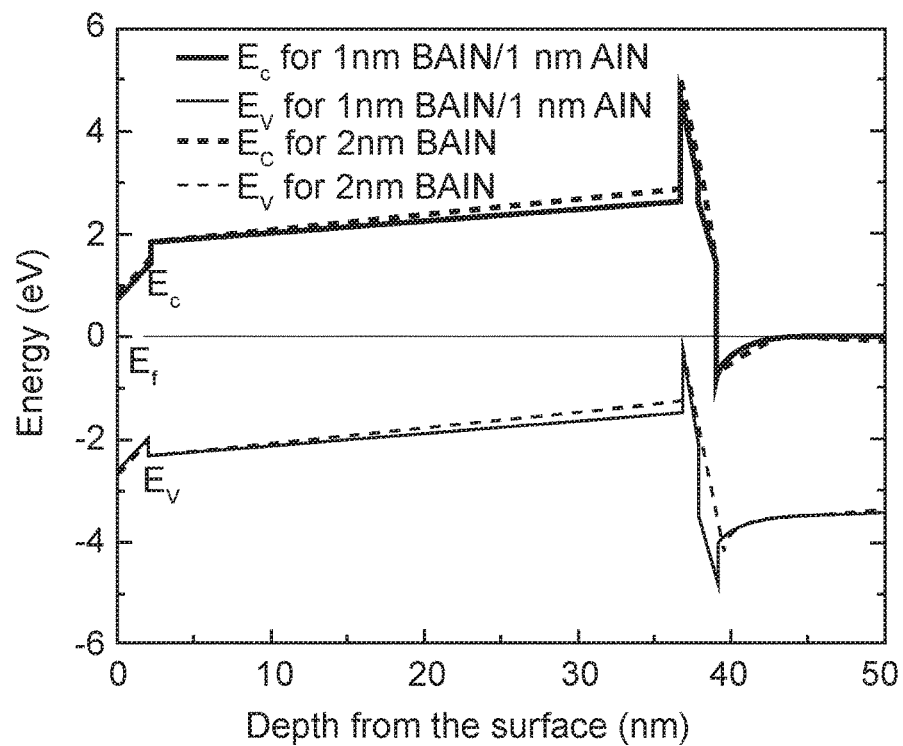
FIG. 7 is a graph of the band structure of high electron mobility transistors according to embodiments.

FIG. 7 illustrates the band structures using a 2 nm $B_{0.14}Al_{0.86}N$ interlayer and a 1 nm $B_{0.14}Al_{0.86}N/1$ nm AlN interlayer. In both cases, the AlGaN barrier layer has a fixed barrier thickness of 35 nm. As illustrated in FIG. 7, there is a strong band bending at the interface of the AlGaN barrier layer and the interlayer, which creates high two-dimensional electron gas concentration in an upper portion of the gallium nitride buffer layer. Because the alloy scattering effect, which may hurt the mobility in high electron mobility transistors, a semiconductor device having a 35 nm $Al_{0.3}Ga_{0.7}N$ barrier layer and 1 nm $B_{0.14}Al_{0.86}N/1$ nm AlN as the interlayer is optimal for high power electronics.

It should be appreciated that in the discussion above, the boron nitride alloy interlayer includes at least 0.1% boron, which indicates an intentional inclusion of boron and not that the boron is part of the contact layer as an impurity or contaminant arising during the formation of the device. Similarly, all references above to a layer including aluminum, gallium, or indium should be understood as the layer including 0.1% aluminum, gallium, or indium, which indicates an intentional inclusion of aluminum, gallium, or indium and not that the aluminum, gallium, or indium is part of the layer as an impurity or contaminant arising during the formation of the device.

Although exemplary embodiments have been described in connection with high electron mobility transistors, the disclosed interlayers can be used in other types of transistors.

The disclosed embodiments provide a high electron mobility transistor and method of production. It should be understood that this description is not intended to limit the invention. On the contrary, the exemplary embodiments are intended to cover alternatives, modifications and equivalents, which are included in the spirit and scope of the invention as defined by the appended claims. Further, in the detailed description of the exemplary embodiments, numerous specific details are set forth in order to provide a comprehensive understanding of the claimed invention. However, one skilled in the art would understand that various embodiments may be practiced without such specific details.

Although the features and elements of the present exemplary embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A method for forming a semiconductor device, the method comprising:

forming a gallium nitride buffer layer;

forming an aluminum nitride interlayer on the gallium nitride buffer layer;

forming a boron aluminum nitride interlayer on the aluminum nitride interlayer; and forming an aluminum gallium nitride barrier layer directly on the boron aluminum nitride interlayer, wherein a portion of the gallium nitride buffer layer includes a two-dimensional electron gas, 2DEG, channel that is adjacent to the aluminum nitride interlayer, and wherein a conduction band minimum of the aluminum gallium nitride barrier layer is higher than a conduction band minimum of the gallium nitride buffer layer, a conduction band minimum of the aluminum nitride interlayer and the boron aluminum nitride interlayer are higher than the conduction band minimum of the gallium nitride buffer layer, and there is a polarization difference between the aluminum nitride interlayer and the gallium nitride buffer layer.

2. The method of claim 1, further comprising:

forming a III-nitride cap layer on the aluminum gallium nitride barrier layer.

3. A semiconductor device, comprising:

a gallium nitride buffer layer, a portion of which includes a two-dimensional electron gas, 2DEG, channel;

an aluminum nitride interlayer arranged on the gallium nitride buffer layer;

a boron aluminum nitride interlayer arranged on the aluminum nitride interlayer; and an aluminum gallium nitride barrier layer arranged directly on the boron aluminum nitride interlayer, wherein the portion of the gallium nitride buffer layer including the 2DEG channel is on a side of the gallium nitride buffer layer adjacent to the aluminum nitride interlayer, and wherein a conduction band minimum of the aluminum gallium nitride barrier layer is higher than a conduction band minimum of the gallium nitride buffer layer, a conduction band minimum of the aluminum nitride interlayer and the boron aluminum nitride interlayer are higher than the conduction band minimum of the gallium nitride buffer layer, and there is a polarization difference between the aluminum nitride interlayer and the gallium nitride buffer layer.

4. The semiconductor device of claim 3, further comprising:
a III-nitride cap layer arranged on the aluminum gallium nitride barrier layer.

\* \* \* \* \*